United States Patent
Sun et al.

(10) Patent No.: US 11,781,240 B2
(45) Date of Patent: Oct. 10, 2023

(54) METHOD FOR PREPARING INDIUM PHOSPHIDE CRYSTAL BY UTILIZING INDIUM-PHOSPHORUS MIXTURE

(71) Applicant: THE 13TH RESEARCH INSTITUTE OF CHINA ELECTRONICS TECHNOLOGY GROUP CORPORATION, Hebei (CN)

(72) Inventors: Niefeng Sun, Hebei (CN); Shujie Wang, Hebei (CN); Yanlei Shi, Hebei (CN); Huimin Shao, Hebei (CN); Lijie Fu, Hebei (CN); Xiaolan Li, Hebei (CN); Yang Wang, Hebei (CN); Senfeng Xu, Hebei (CN); Huisheng Liu, Hebei (CN); Tongnian Sun, Hebei (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 262 days.

(21) Appl. No.: 17/415,952

(22) PCT Filed: Sep. 10, 2020

(86) PCT No.: PCT/CN2020/114333
§ 371 (c)(1),
(2) Date: Jun. 18, 2021

(87) PCT Pub. No.: WO2021/098348
PCT Pub. Date: May 27, 2021

(65) Prior Publication Data
US 2022/0081799 A1    Mar. 17, 2022

(30) Foreign Application Priority Data
Nov. 22, 2019 (CN) .......................... 201911155615.0

(51) Int. Cl.
*C30B 15/02* (2006.01)
*C30B 15/20* (2006.01)
(Continued)

(52) U.S. Cl.
CPC .............. *C30B 15/02* (2013.01); *C30B 15/20* (2013.01); *C30B 28/10* (2013.01); *C30B 29/40* (2013.01)

(58) Field of Classification Search
CPC ......... C30B 15/02; C30B 15/20; C30B 28/10; C30B 29/40
See application file for complete search history.

(56) References Cited

U.S. PATENT DOCUMENTS

| | | | | |
|---|---|---|---|---|
| 5,252,175 A | * | 10/1993 | Bachowski | ............. C30B 17/00 117/953 |
| 5,431,125 A | * | 7/1995 | Bachowski | ............. C30B 29/40 117/17 |
| 2005/0223971 A1 | * | 10/2005 | Wachi | ..................... C30B 29/42 117/223 |

FOREIGN PATENT DOCUMENTS

| | | | |
|---|---|---|---|
| CA | 1284761 | * | 6/1991 |
| CN | 102628180 A | | 8/2012 |

(Continued)

OTHER PUBLICATIONS

International Search Report and Written Opinion dated Dec. 8, 2020 in PCT/CN2020/114333.

(Continued)

*Primary Examiner* — Robert M Kunemund
(74) *Attorney, Agent, or Firm* — Enable IP, P.C.

(57) ABSTRACT

The invention discloses a method for preparing an indium phosphide crystal by using an indium-phosphorus mixture, belongs to the technical field of semiconductors, and comprises the steps of preparing an indium-phosphorus mixed ball, charging, maintaining the high furnace pressure and the (Continued)

low temperature of the indium-phosphorus mixed ball, melting a covering agent, feeding, synthesizing and crystal growing, which is synthesized by directly melting the proportioned indium-phosphorus mixed ball. Indium powder and phosphorus powder are uniformly mixed and pressed into spherical indium-phosphorus mixed particles, then the mixture of the indium-phosphorus mixed balls and the boron oxide powder is fed into a melt with a boron oxide covering agent, and crystal growth in situ is performed after synthesis. The method has the advantages of short reaction time, high efficiency and raw material saving, which can effectively reduce the risk of contamination of materials, saves procedures and reduces the material preparation cost.

10 Claims, 3 Drawing Sheets

(51) Int. Cl.
*C30B 28/10* (2006.01)
*C30B 29/40* (2006.01)

(56) References Cited

FOREIGN PATENT DOCUMENTS

| | | | |
|---|---|---|---|
| CN | 102965734 | A | 3/2013 |
| CN | 106206841 | A | 12/2016 |
| CN | 110760931 | A | 2/2020 |
| CN | 110760932 | A | 2/2020 |
| CN | 211112317 | U | 7/2020 |
| EP | 0476389 | * | 3/1992 |
| EP | 1739210 | A1 | 1/2007 |
| JP | S60118696 | A | 6/1985 |
| JP | S62246899 | A | 10/1987 |
| WO | WO 99/21216 | * | 10/1998 |

OTHER PUBLICATIONS

Office Action dated Jun. 5, 2020 in CN 201911155615.0.
Office Action dated Oct. 16, 2020 in CN 201911155615.0.

* cited by examiner

METHOD FOR PREPARING INDIUM PHOSPHIDE CRYSTAL BY UTILIZING INDIUM-PHOSPHORUS MIXTURE

TECHNICAL FIELD

The invention belongs to the technical field of semiconductors, relates to preparation of indium phosphide, and particularly relates to a method for synthesizing indium phosphide by using an indium-phosphorus mixed ball.

BACKGROUND ART

Indium phosphide (InP) is a group III-V compound semiconductor material composed of group III element indium (In) and group V element phosphorus (P), which plays an important strategic role in the field of semiconductor materials and is an irreplaceable semiconductor material for optoelectronic and microelectronic devices. Compared with Germanium and silicon materials, InP has many advantages: direct transition type energy band structure, high electro-optic conversion efficiency; high electron mobility, easy to make semi-insulating materials, suitable for high frequency microwave devices and circuits; high operating temperature; strong anti-radiation ability; and high conversion efficiency as solar cell material. Therefore, InP and other materials are widely used in solid state lighting, microwave communication, optical fiber communication, microwave, millimeter wave devices, radiation resistant solar cells and other high-tech fields. With the development of energy band engineering theory, ultra-thin material technology and deep sub-micron manufacturing technology, InP has more and more advantages in high-end microwave and millimeter-wave electronic devices and optoelectronic devices, as the preferred material for millimeter wave high-end devices, it has been paid more and more attention and has a bright future in development and application. The realization of high-end InP-based microelectronic and optoelectronic devices depends on the preparation of high quality InP single crystals with good integrity, uniformity and thermal stability. InP polycrystalline materials with high purity, different melt proportions and no inclusions are the prerequisites for the production of high-quality InP single crystals and the study of InP-related characteristics. Many properties of InP single crystals are related to the properties of the starting material, i.e. the properties of the polycrystalline material, such as the proportion of the polycrystalline material and the purity of the material. The properties of polycrystalline materials have great effects on crystal growth, electrical properties, crystal integrity, uniformity and so on.

At present, several common methods for synthesizing InP polycrystalline materials and the problems thereof are as follows:

(1) Horizontal Bridgman method (HB) and horizontal gradient freeze method (HGF): InP materials were synthesized by the horizontal Bridgman method (HB) and the horizontal gradient freeze method (HGF). In terms of the synthesis process, the larger the synthesis amount, the longer the synthesis time. In general, the synthesis of 1.5 Kg InP polycrystalline by HB/HGF technology takes about 24 h, so the more obvious the contamination of Si is (the source is quartz pipe wall).

(2) Phosphorus injection method synthesis technology: the phosphorus injection method is that gasified phosphorus vapor is injected into an indium melt, the contact area of the phosphorus gas and the indium melt is accelerated, convection in the indium melt is increased through rotation of a crucible, the diffusion of solute in a solute diffusion layer is accelerated, thus the synthesis process is accelerated. Because the method relies on the pressure difference between the inside and outside of the quartz phosphorus container to inject phosphorus vapor, if the pressure difference is not controlled properly, it is easy to produce explosion bubbles; further, part of the phosphorus vapor is not absorbed by the indium melt, on the one hand, it affects the synthesis effect, on the other hand, the lost phosphorus vapor volatilizes to the furnace body, which brings great trouble to the furnace body cleaning. And it requires very high thermal field control in the synthesis system.

The synthesis methods of the horizontal Bridgman method (HB), the horizontal gradient freeze method (HGF) and the ultra-high pressure direct synthesis technology are to perform InP synthesis in a synthesis furnace, the synthesized InP polycrystalline material is taken out of the synthesis furnace, the polycrystalline material is subjected to cleaning corrosion treatment, and the InP single crystals are grown in a high-pressure single crystal furnace. Synthesis and crystal growth are performed by using a "two-step" method, which greatly increases the likelihood of contamination of the material and increases the cost of material preparation.

SUMMARY OF THE INVENTION

The invention provides a method for preparing indium phosphide by using an indium-phosphorus mixture, which is characterized in that an indium-phosphorus mixed ball is quickly fed into a crucible covered with liquid boron oxide, after the required synthesis amount is reached, an indium phosphide crystal is formed by pulling an indium-phosphorus melt, the synthesis speed of the method is higher, the control requirement on a synthesis system is low, and industrial production is facilitated.

The technical scheme of the invention is as follows: a method for preparing an indium phosphide crystal by using an indium-phosphorus mixture, comprises the following steps of:

1) preparing an indium-phosphorus mixed ball: uniformly mixing indium powder and red phosphorus powder according to a designed mass ratio, and pressing into a spherical shape;

2) charging: putting the indium-phosphorus mixed ball mixed boron oxide powder into a feeder in a furnace body, and putting a boron oxide block into a crucible;

3) keeping high furnace pressure and low temperature of the indium-phosphorus mixed ball: keeping the low temperature of the indium-phosphorus mixed ball in the process of feeding the indium-phosphorus mixed ball from the feeder to the crucible, preventing indium or phosphorus from melting and gasifying, and keeping the pressure in the furnace greater than the dissociation pressure of indium phosphide;

4) melting covering agent: heating the crucible, melting a boron oxide block, and covering the bottom of the crucible with a boron oxide liquid;

5) feeding, synthesizing and crystal growing: feeding the mixture of the indium-phosphorus mixed ball and the boron oxide powder into a crucible below the liquid level of the boron oxide, simultaneously controlling the temperature of the crucible to enable the indium-phosphorus to react to synthesize indium phosphide, adjusting the temperature after the melt amount of the indium phosphide reaching a set amount, and carrying out crystal growth by adopting a high-pressure liquid encapsulation pulling method.

The method is synthesized by directly melting the proportioned indium-phosphorus mixed balls. Firstly, in a high-pressure system, indium powder and phosphorus powder are uniformly mixed and pressed into spherical indium-phosphorus mixed particles, and then the mixture of the indium-phosphorus mixed balls and the boron oxide powder is fed into a melt with a boron oxide covering agent. Due to the large contact area of indium powder and phosphorus powder, indium powder can melt at high temperature to increase the local concentration of indium, and the synthesis speed is accelerated as the phosphorus heated and volatilized. The method has the advantages of short reaction time, high efficiency and raw material saving, which can realize in-situ crystal growth after synthesis, can effectively reduce the risk of contamination of materials, saves procedures and reduces the material preparation cost. The boron oxide powder is used for preventing adhesion between the indium-phosphorus mixed balls so as to keep loose and easy to feed.

Further, in the step 3), the step of maintaining the high furnace pressure and the low temperature of the indium-phosphorus mixed ball comprises the following steps of: vacuumizing the furnace body to $10\text{-}10^{-5}$ Pa, filling low-temperature inert gas, keeping the low-temperature inert gas to flow along the feeding path and then sending the low-temperature inert gas to the upper part of the crucible from top to bottom, keeping the pressure in the furnace to be 3.5-5.0 MPa, and ensuring that the pressure in the feeding space is 0.05-0.1 MPa higher than the pressure in the synthesis growth space.

The flowing and feeding of the low-temperature inert gas can keep the low temperature of the indium-phosphorus mixed ball in the process of feeding the indium-phosphorus mixed ball from the feeder to the crucible, and the indium or phosphorus does not melt and gasify so as to prevent the indium from melting and sticking the wall and the phosphorus from volatilizing in the feeding process and avoid influencing the synthesis proportion. Indium phosphide dissociation can be avoided by maintaining the furnace pressure at 3.5-5.0 MPa. Meanwhile, because the pressure of the feeding space is higher than the pressure of the synthesis growth space by 0.05-0.1 MPa, and the low-temperature gas enters from above, the indium-phosphorus mixed ball and the low-temperature gas can enter the crucible above the synthesis growth space together, and the indium-phosphorus mixed ball is prevented from "indium or phosphorus melting and gasifying" before entering the melt.

Further, the temperature of the low temperature inert gas is below 156° C. The temperature of the inert gas is kept lower than the melting point of indium, so that the indium can be prevented from melting and sticking walls in the feeding process, and the phosphorus can be prevented from gasifying.

Furthermore, the low-temperature inert gas adopts nitrogen or argon which is low in cost and stable in property.

Furthermore, in order to lower the temperature of the indium-phosphorus mixed ball and prevent the feeding pipe from being overheated and damaged, the step of keeping the low temperature of the indium-phosphorus mixed ball further comprises: introducing a cooling liquid into the pipe wall of a feeding pipe for feeding the indium-phosphorus mixed ball to the crucible.

Further, in the step 1), the mass ratio of indium powder to phosphorus powder is 3.7:1.0-1.5.

According to the proportion, the proportion of indium and phosphorus atoms in the synthesized melt can reach 1:1, so that high-quality indium phosphide single crystal or polycrystal can be prepared.

Further, in order to ensure the synthesis rate and effect, the temperature in the crucible in the step 5) is 1080-1200° C.

Furthermore, in order to ensure the crystal pulling growth effect, in the step 5), the set amount of the indium phosphide melt is 10%-80% of that the liquid level height of the indium phosphide melt accounts for the height in the crucible.

Further, the reaction process synthesized in the step 5) comprises reaction of gaseous phosphorus with an indium-phosphorus melt and fusion of liquid indium with the indium-phosphorus melt. For the first or successive first few indium-phosphorus mixed balls, the indium in the indium-phosphorus mixed balls melts, the phosphorus sublimes into (P1, P2, P4) gases upon heating and forms bubbles, the phosphorus gases react with the melt and enter the indium-phosphorus melt as atoms. Indium in the subsequent indium-phosphorus mixed ball is melted and fused with the indium-phosphorus melt, phosphorus is sublimed into phosphorus gas by heating, and the phosphorus gas reacts with the indium-phosphorus melt and is absorbed by the indium-phosphorus melt.

Further, the step 5) further comprises a feed supplement step, wherein in the feed supplement step, the operation space of putting the indium-phosphorus mixed ball mixed boron oxide powder into the feeder and the synthesis and crystal growth space are mutually isolated. The two spaces are isolated, feed supplement can be carried out at the same time of synthesis, and influence on synthesis pressure, temperature and reaction state is avoided.

The invention has the beneficial effects that: 1. By adopting the method, the proportioned indium-phosphorus mixed balls can be directly fed into a crucible to be melted and synthesized, and crystal growth can be carried out in situ after synthesis; the operation flow is simplified, the control requirement is reduced, the synthesis speed is higher, the crystal preparation efficiency is higher, and the industrialized production is facilitated. 2, By adopting the method to prepare the indium phosphide crystal, the volatilization amount of phosphorus can be reduced, the material pollution is reduced, the crystal purity is improved, the material cost is reduced, and the proportioned high-quality indium phosphide crystal can be synthesized and grown conveniently.

Figure 1:
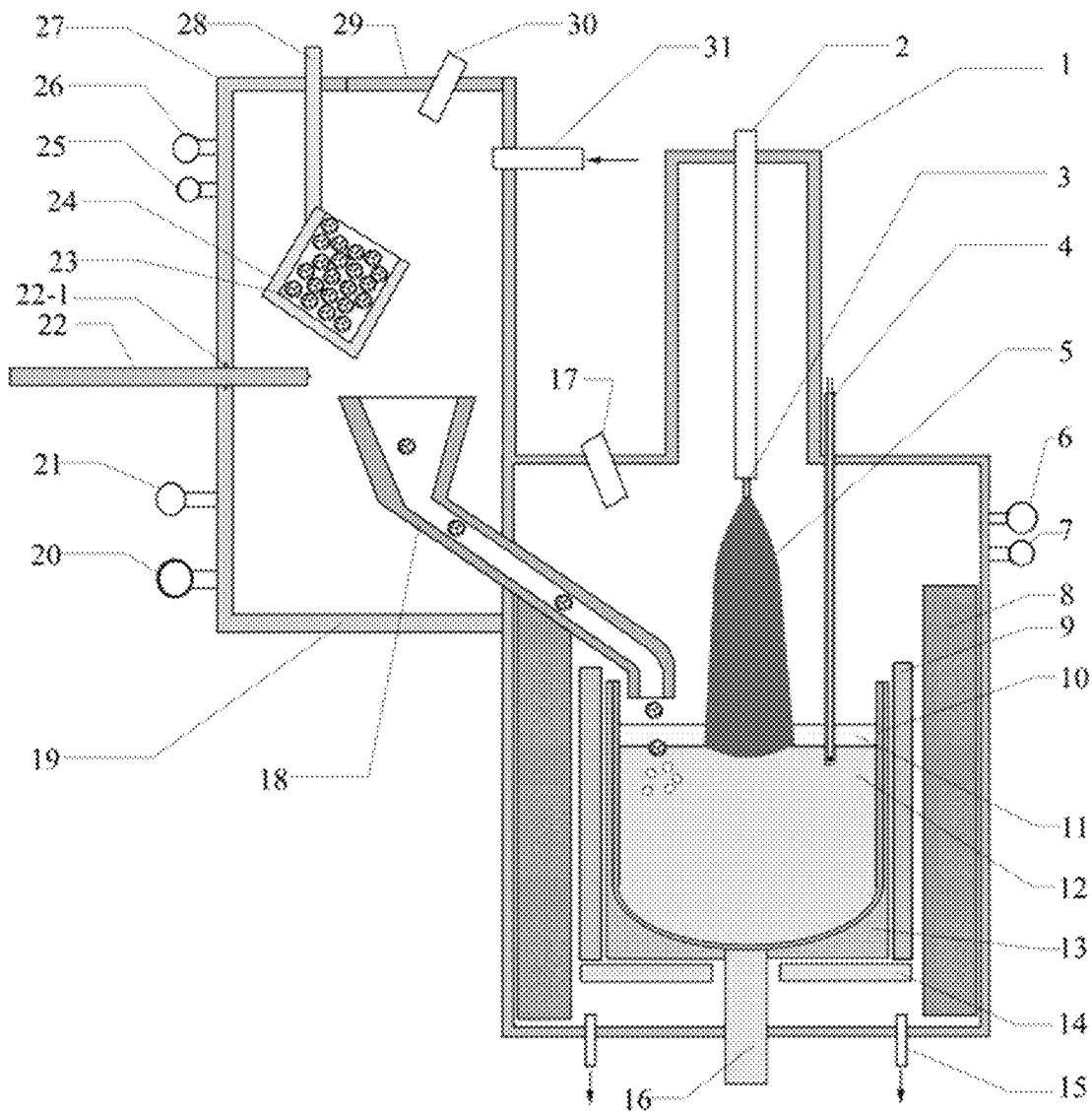
FIG. 1 is a schematic view showing a structure of an indium phosphide crystal system prepared from an indium-phosphorus mixture in an embodiment.

In the drawings, 1 represents a synthesis growth chamber, 2 represents a seed crystal rod, 3 represents a seed crystal, 4 represents a melt temperature thermocouple, 5 represents a crystal, 6 represents a pressure gauge I, 7 represents a vacuum gauge I, 8 represents a thermal insulation jacket, 9 represents a main heater, 10 represents a crucible, 11 represents a boron oxide covering agent, 12 represents an indium-phosphorus melt, 13 represents a crucible support, 14 represents a lower heater, and 15 represents a gas outlet. 16 represents a crucible rod, 17 represents a first observation window, 18 represents a feeding pipe, 19 represents a feeding chamber, 20 represents a vacuum gauge II, 21 represents a pressure gauge II, 22 represents a insertion plate, 22-1 represents a sealing ring I, 23 represents an indium-phosphorus mixed ball, 24 represents a loader, 25 represents a vacuum gauge III, 26 represents a pressure gauge III, 27 represents a charging chamber, 28 represents a mechanical arm, 29 represents a charging door, and 30 represents a second observation window; 31 represents a gas inlet. 32 represents a roll-over driving device, 32-1 represents a protective cover, 32-2 represents a heat insulating layer, 32-3 represents a motor, 32-4 represents a sealing ring II, 32-5 represents a pin, 33 represents a conductive wire and 34 represents a flange.

DETAILED DESCRIPTION OF THE INVENTION

The present invention will now be described in detail with reference to the accompanying drawings and embodiments.

The method is based on a system for preparing an indium phosphide crystal by utilizing an indium-phosphorus mixture, wherein the system comprises a vacuum system, an inflation and deflation system, a temperature and pressure control system, an electrical control system, a cooling circulation system and a weighing system. These systems are common basic systems in the art, especially single crystal furnaces for preparing indium phosphide crystals based on an in-situ synthesis method, and these systems are basic configurations and will not be described in detail herein. In order to prepare indium phosphide crystal by using indium-phosphorus mixed ball, the system improves the furnace body.

Referring to FIG. 1, the furnace body is divided into a synthesis growth chamber 1, a feeding chamber 19 and a charging chamber 27, the charging chamber 27 and the feeding chamber 19 are separated up and down by means of an insertion plate 22, a sealing ring I 22-1 is arranged between the insertion plate 22 and the furnace wall, and when the insertion plate is inserted, the charging chamber 27 and the feeding chamber 19 can be isolated and sealed. A roll-over feeder is arranged in the charging chamber 27, a feeding pipe 18 is arranged in the feeding chamber 19, one end of the feeding pipe 18 is in butt joint with the roll-over feeder upwards, and one end of the feeding pipe 18 extends downwards into the synthesis growth chamber 1.

A lower heater 14, a main heater 9, an insulating sleeve 8, a crucible 10, a matched crucible support 13 and a crucible rod 16 are arranged in the synthesis growth chamber 1. The crucible 10 is positioned on a graphite crucible support 13 which is fixedly connected to a crucible rod 16. A lower heater 14 and a main heater 9 are arranged at the periphery of the crucible 10 and the crucible support 13, and an insulating sleeve 8 is arranged between the main heater 9 and the inner wall of the synthesis growth chamber 1. The other end of the crucible rod 16 extends out of the furnace bottom of the synthesis growth chamber 1 and is connected to a crucible rod rotation lifting mechanism. The crucible rod rotation lifting mechanism is a common basic mechanism for single crystal furnaces and synthesis furnaces in the art, and is used for driving the crucible to lift and rotate so as to uniformly mix indium and phosphorus and fully react, and will not be described in detail herein. A seed crystal rod 2 is arranged above the crucible 10, a seed crystal 3 and a weighing sensor are fixed on the seed crystal rod 2, and the seed crystal rod 2 penetrates out of the top cover of the synthesis growth chamber 1 and is connected with a seed crystal rod lifting mechanism. The seed crystal rod lifting mechanism can drive the seed crystal 3 to lift so as to pull and grow the crystal. The weighing sensor and weighing system can calculate the growth weight of the crystal. The seed crystal rod 2, the weighing sensor and the weighing system, and the seed crystal rod lifting mechanism are common basic mechanisms of a single crystal furnace for lifting and growing crystals and are not described in detail herein. The synthesis growth chamber 1 is further provided with a melt temperature thermocouple 4, a pressure gauge I 6 and a vacuum gauge I 7, wherein the bottom I is provided with a gas outlet 15, and the top of is provided with a first observation window 17. A vacuum gauge II 20 and a pressure gauge II 21 are installed on the furnace wall of the feeding chamber 19. The feeding pipe 18 comprises a funnel section at the top and an inclined pipe section leading from the feeding chamber 19 into the growth chamber 1, the inclined pipe section extending above the crucible 10.

Figure 4:
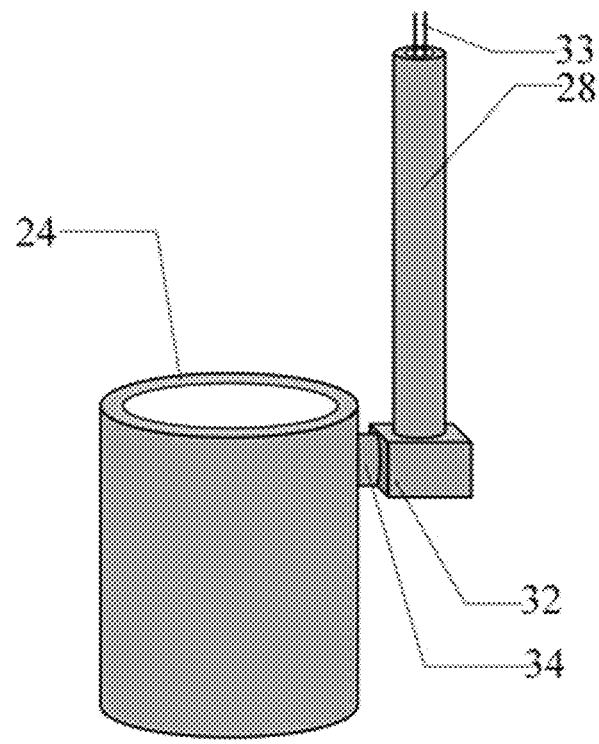
FIG. 4 is a schematic view showing the structure of the roll-over feeder in the embodiment.
Figure 5:
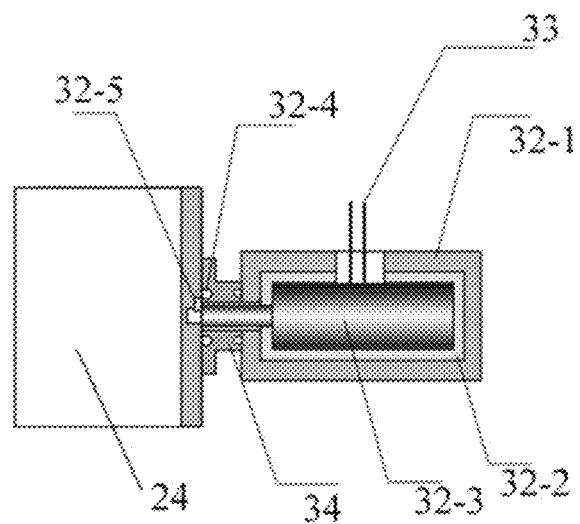
FIG. 5 is a schematic view showing a connection structure of a motor and a loader in the embodiment.

A charging door 29 is arranged at the top of the charging chamber, a gas inlet 31 is formed and a vacuum gauge III 25 and a pressure gauge III 26 are installed in the furnace wall, and a second observation window 30 is formed in the charging door 29. The roll-over feeder in the charging chamber 27 comprises a mechanical arm 28, a loader 24 and a loader roll-over driving device 32, see FIGS. 4 and 5, wherein the upper end of the mechanical arm 28 is positioned at the top of the charging chamber 27, the lower end of the mechanical arm 28 is connected with the roll-over driving device 32, and the roll-over driving device 32 is connected with the loader 24. The loader roll-over driving device 32 employs a motor 32-3 positioned at the bottom end of the robotic arm 28, the motor 32-3 shaft being connected to the loader 24 by a pin 32-5. An insulating layer 32-2 and a protective cover 32-1 are coated outside the motor 32-3, a flange 34 is coated outside the motor shaft, and a sealing ring II 32-4 is arranged. A conductive wire 33 passes through the mechanical arm 28 to connect to the electrical control system.

The inflation and deflation system comprises a low-temperature inert gas reservoir, a gas inlet 31 and a gas outlet 15. Inert gas below 156° C. enters the feeding chamber 19 from the charging chamber 27 and exits the gas outlet 15 through the feed pipe 18 into the growth chamber 1. The pressure in the furnace is 3.5-5.0 MPa.

The method comprises the following specific steps of: 1) Uniformly mixing the high-purity indium powder and the high-purity phosphorus powder according to a mass ratio of 3.7:1.0-1.5, and pressing into spherical indium-phosphorus mixed balls 23.

2) Placing the indium-phosphorus mixed ball 23 mixed boron oxide powder in the loader 24 in the charging chamber 27, and placing bulk boron oxide in the crucible 10.

3) Vacuumizing the whole system to $10\text{-}10^{-5}$ Pa through the gas inlet 31, filling inert gas lower than 156° C. into the charging chamber 19 and the feeding chamber 27 through the gas inlet 31, and enabling the low-temperature inert gas to enter the synthesis growth chamber 1 through the feeding pipe 18, so that the indium-phosphorus mixed balls 23 always keep in low temperature. During the whole synthesis process, the gas flow between the gas inlet 31 and the gas outlet 15 are maintained and the pressure is stable, the pressure is 3.5-5.0 MPa, and the pressure in the feeding chamber 19 is 0.05-0.1 MPa higher than that in the synthesis growth chamber 1.

4) Heating the crucible 10 through the main heater 9 and the lower heater 14, adjusting the crucible 10 to rotate to 5-35 revolutions per minute, spreading the whole crucible 10 to form a boron oxide covering agent 11 after the block boron oxide is melted, and inserting the melt temperature thermocouple 4 into the interface between the boron oxide covering agent 11 and the bottom of the crucible 10.

Figure 2:
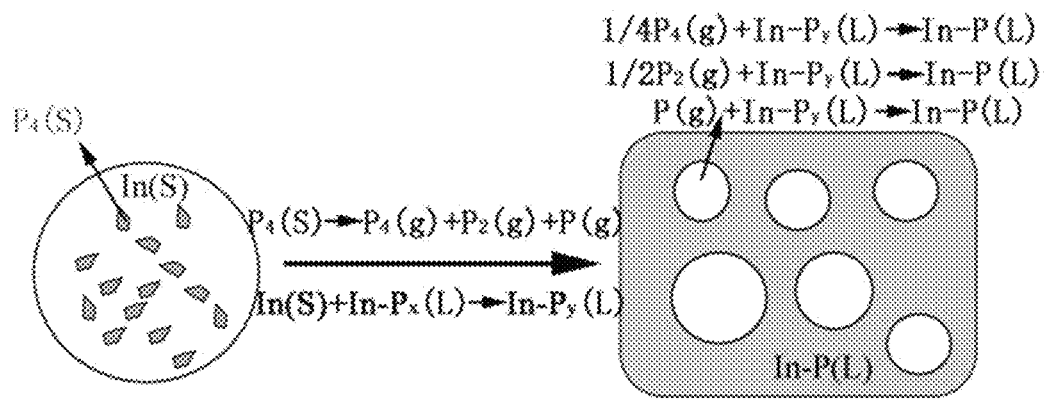
FIG. 2 is a reaction mechanism diagram of an indium-phosphorus mixture fed into an In-P melt.

5) Feeding the indium-phosphorus mixed ball 23 in the loader 24 into the feeding pipe 18 through the mechanical arm 28, dropping the indium-phosphorus mixed ball 23 into the crucible 10, and observing the dropping condition of the indium-phosphorus mixed ball 23 at the mouth of the feeding pipe 18 through the first observation window 17. Referring to FIG. 2, for the first or successive first few indium-phosphorus mixed balls 23, indium in the indium-phosphorus mixed balls 23 melts, phosphorus sublimes into phosphorus gas upon heating, and the phosphorus gas reacts with and is absorbed by the indium melt to form the indium-phosphorus melt 12. Indium in the subsequent indium-phosphorus mixed ball 23 melts and reacts with the indium-phosphorus melt 12 to form an indium-phosphorus melt 12 of a new ingredient, phosphorus of the indium-phosphorus mixed ball 23 is sublimed into phosphorus gas by heating, and the phosphorus gas reacts with and is absorbed by the indium-phosphorus melt 12. After the amount of the synthesized indium-phosphorus melt 12 reaches to cover the bottom of the crucible, the seed crystal 3 is lowered, and the boron oxide covering agent 11 is pulled out.

Figure 3:
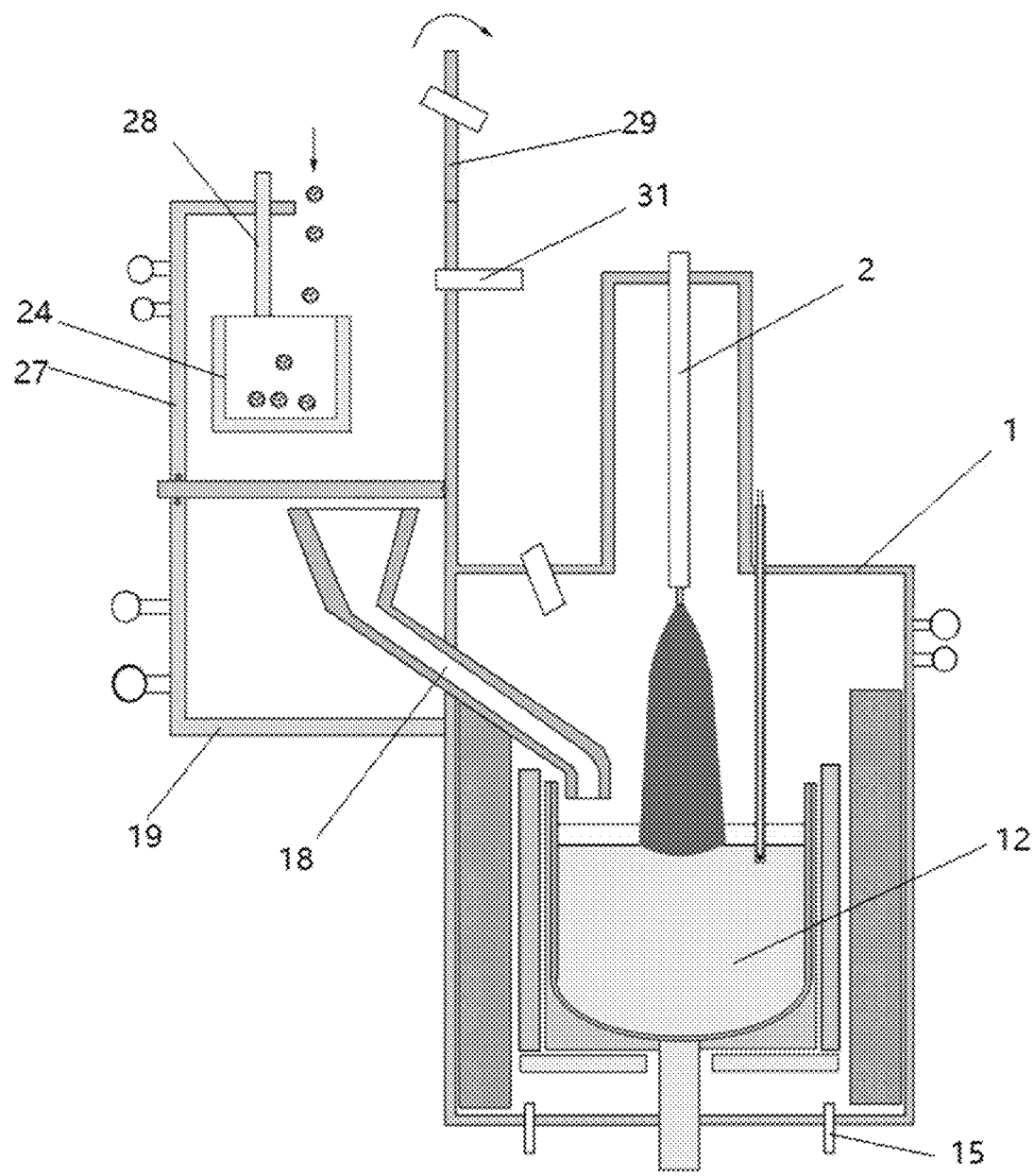
FIG. 3 is a schematic view showing the structure of the charging chamber during feed supplement in the embodiment.

6) Observing the number of the indium-phosphorus mixed balls 23 in the loader 24 through the second observation window 30. After the indium-phosphorus mixed balls 23 in the loader 24 are feeding, referring to FIG. 3, the insertion plate 22 is inserted so that the feeding chamber 19 is isolated from the charging chamber 27, and the pulling growth is continued in the synthesis and growth chamber 1. At the same time, high-pressure gas in the charging chamber 27 is discharged from the gas inlet 31 to atmospheric pressure, then the charging door 29 is opened, the indium-phosphorus mixed balls 23 are fed into the loader 24, the charging door 29 is closed, vacuumized from the gas inlet 31, inert gas below 156° C. is charged until the temperature of the charging chamber 27 is the same as the synthesis and growth chamber 1 and the feeding chamber 19, and the insert 22 is opened, the indium-phosphorus mixed balls 23 in the loader 24 are fed into the crucible 10 through the feeding pipe 18 by the mechanical arm 28 to continue synthesis and to continue to be pulled to form the crystal 5.

The invention claimed is:

1. A method for preparing an indium phosphide crystal by using an indium-phosphorus mixture, characterized by comprising following steps of:
   1) preparing an indium-phosphorus mixed ball: uniformly mixing indium powder and red phosphorus powder according to a designed mass ratio, and pressing into a spherical shape;
   2) charging: putting the indium-phosphorus mixed ball mixed boron oxide powder into a feeder in a furnace body, and putting a boron oxide block into a crucible;
   3) keeping high furnace pressure and low temperature of the indium-phosphorus mixed ball:
   keeping the low temperature of the indium-phosphorus mixed ball in the process of feeding the indium-phosphorus mixed ball from the feeder to the crucible, preventing indium or phosphorus from melting and gasifying, and keeping the pressure in the furnace greater than the dissociation pressure of indium phosphide;
   4) melting covering agent: heating the crucible, melting the boron oxide block, and covering the bottom of the crucible with a boron oxide liquid;
   5) feeding, synthesizing and crystal growing: feeding the mixture of the indium-phosphorus mixed ball and the boron oxide powder into a crucible below the liquid level of the boron oxide, simultaneously controlling the temperature of the crucible to enable the indium-phosphorus to react to synthesize indium phosphide, adjusting the temperature after the melt amount of the indium phosphide reaching a set amount, and carrying out crystal growth by adopting a high-pressure liquid encapsulation pulling method.

2. The method for preparing the indium phosphide crystal by using the indium-phosphorus mixture of claim 1, characterized in that in the step 3), the step of maintaining the high furnace pressure and the low temperature of the indium-phosphorus mixed ball comprises the following steps of: vacuumizing the furnace body to $10\text{-}10^{-5}$ Pa, filling low-temperature inert gas, keeping the low-temperature inert gas to flow along the feeding path and then sending to the upper part of the crucible from top to bottom, keeping the pressure in the furnace to be 3.5-5.0 MPa, and ensuring that the pressure in the feeding space is 0.05-0.1 MPa higher than the pressure in the synthesis growth space.

3. The method for preparing the indium phosphide crystal by using the indium-phosphorus mixture of claim 2, characterized in that: the temperature of the low-temperature inert gas is below 156° C.

4. The method for preparing the indium phosphide crystal by using the indium-phosphorus mixture of claim 2, characterized in that: the low-temperature inert gas is nitrogen or argon.

5. The method for preparing the indium phosphide crystal by using the indium-phosphorus mixture of claim 2, characterized in that the step of keeping the low temperature of the indium-phosphorus mixed ball further comprises: introducing a cooling liquid into the pipe wall of a feeding pipe for feeding the indium-phosphorus mixed ball to the crucible.

6. The method for preparing the indium phosphide crystal by using the indium-phosphorus mixture of claim 1, characterized in that: in the step 1), the mass ratio of indium powder to phosphorus powder is 3.7:1.0-1.5.

7. The method for preparing the indium phosphide crystal by using the indium-phosphorus mixture of claim 1, characterized in that: the temperature of the crucible in step 5) is 1080-1200° C.

8. The method for preparing the indium phosphide crystal by using the indium-phosphorus mixture of claim 1, characterized in that: in the step 5), the set amount of the indium phosphide melt is 10%-80% of that the liquid level height of the indium phosphide melt accounts for the height in the crucible.

9. The method for preparing the indium phosphide crystal by using the indium-phosphorus mixture of claim 1, characterized in that: the reaction process synthesized in the step 5) comprises reaction of gaseous phosphorus with an indium-phosphorus melt and fusion of liquid indium with the indium-phosphorus melt.

10. The method for preparing the indium phosphide crystal by using the indium-phosphorus mixture of claim 1, characterized in that: the step 5) further comprises a feed supplement step, wherein in the feed supplement step, the operation space of putting the indium-phosphorus mixed ball mixed boron oxide powder into the feeder and the synthesis and crystal growth space are mutually isolated.

* * * * *